United States Patent
Fan et al.

(10) Patent No.: US 9,489,481 B2
(45) Date of Patent: Nov. 8, 2016

(54) LAYOUT DESIGN METHOD AND SYSTEM

(71) Applicant: Semiconductor Manufacturing International (Shanghai) Corporation, Shanghai (CN)

(72) Inventors: Qiang Fan, Shanghai (CN); Xue Li, Shanghai (CN)

(73) Assignee: Semiconductor Manufacturing International (Shanghai) Corporation (CN)

(*) Notice: Subject to any disclaimer, the term of this patent is extended or adjusted under 35 U.S.C. 154(b) by 0 days.

(21) Appl. No.: 14/735,952

(22) Filed: Jun. 10, 2015

(65) Prior Publication Data
US 2015/0370957 A1 Dec. 24, 2015

(30) Foreign Application Priority Data
Jun. 19, 2014 (CN) .......................... 2014 1 0276868

(51) Int. Cl.
*G06F 9/455* (2006.01)
*G06F 17/50* (2006.01)

(52) U.S. Cl.
CPC ............................ *G06F 17/5081* (2013.01)

(58) Field of Classification Search
USPC ................... 716/110, 111, 112, 113
See application file for complete search history.

(56) References Cited

U.S. PATENT DOCUMENTS

2008/0120586 A1* 5/2008 Hoerold ............. G06F 17/5081
 716/52
2009/0031274 A1* 1/2009 Arp ..................... G06F 17/5077
 716/126

* cited by examiner

*Primary Examiner* — Brian Ngo
(74) *Attorney, Agent, or Firm* — Innovation Counsel LLP

(57) ABSTRACT

A layout design method is disclosed. The layout design method includes: (a) providing an original layout file; (b) performing a redundant via (RV) filling on the original layout file so as to generate a second layout file; (c) merging the second layout file with the original layout file to generate a third layout file; (d) performing a design rule check (DRC) verification on the third layout file by directly invoking a DRC code in a Process Design Kit (PDK); (e) generating, based on a result of the DRC verification, a fourth layout file including DRC errors; (f) performing a layout operation to remove DRC errors from the second layout file using the fourth layout file, so as to generate a fifth layout file; and (g) merging the fifth layout file with the original layout file to generate a sixth layout file.

12 Claims, 8 Drawing Sheets

FIG. 1 (Prior Art)

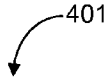

```
#!/bin/csh  -f
......
......
 ####Invoke PDK DRC deck to check
 /bin/sed "s#TOPCELL2#$topcell_rv#g" $drc_rule | /bin/sed "s#GDS2#${j}${rvgds}#g"
 | /bin/sed "s#TOPCELL1#$topcell1#g" | /bin/sed "s#GDS1#$gds1#g" | /bin/sed
 "s#TOTAL_META   L_LAYERS_NO#$total_metal_counts#g" | /bin/sed
 "s#2X_METAL_LAYERS_NO#$SMIC2X_metal_counts#g" | /bin/sed
 "s#8X_TOP_METAL_LAYERS_NO#$SMIC8X_top_metal_counts#g" | /bin/sed "
 s#10X_TOP_METAL_LAYERS_NO#$SMIC10X_top_metal_counts#g" | /bin/sed
 "s#MTT2_TOP_METAL_LAYERS_NO#$MTT2_top_metal_counts#g" | /bin/sed
 "s#DATABASE_FORMAT#$DBtype#g" | /bin/sed "s#DRCERRORGDS#$drcgds#g" |
 /bin/sed "s#DRCCHECKSUM#$drcsum#g" | /bin/sed
 "s#DRCERROR_DATATYPE#$drcerrordatatype#g" > drc$i.tvf
 calibre -drc -hier -hyper -turbo -64 drc$i.tvf   |& tee drc$i.log
......
......
```

LAYOUT DESIGN METHOD AND SYSTEM

CROSS-REFERENCE TO RELATED APPLICATION

This application claims priority to Chinese Patent Application No. 201410276868.4 filed on Jun. 19, 2014, the disclosure of which is incorporated herein by reference in its entirety.

BACKGROUND

1. Technical Field

The present disclosure generally relates to integrated circuit (IC) design and manufacturing technology. More particularly, it discloses an IC layout design method and system.

2. Description of the Related Art

As semiconductor technology advances to 40 nm process node and below, redundant vias (RVs) are often inserted into a layout design. Inserting an RV into a layout design typically includes replacing a single square through hole with a rectangular through hole (also known as a through hole strip) or a double square through hole. Inserting RVs can reduce the risk of via opens and reduce interconnect resistance, thereby improving product yield. As a result, RV insertion is a key component in design for manufacturability (DFM) of semiconductor devices.

Presently, the RV insertion typically includes filling RVs in the layout (RV filling), performing a design rule check (DRC) verification, and performing a layout operation at the same time. The above functions are commonly performed by a single module. However, the RV insertion described above poses several issues during the layout design method. For example, each DRC code needs to be modified to update/change a layer name, so that the results of the RV filling can be invoked in a script. This may result in a high workload, especially when the design rules increase in complexity or are frequently upgraded.

Figure 1:
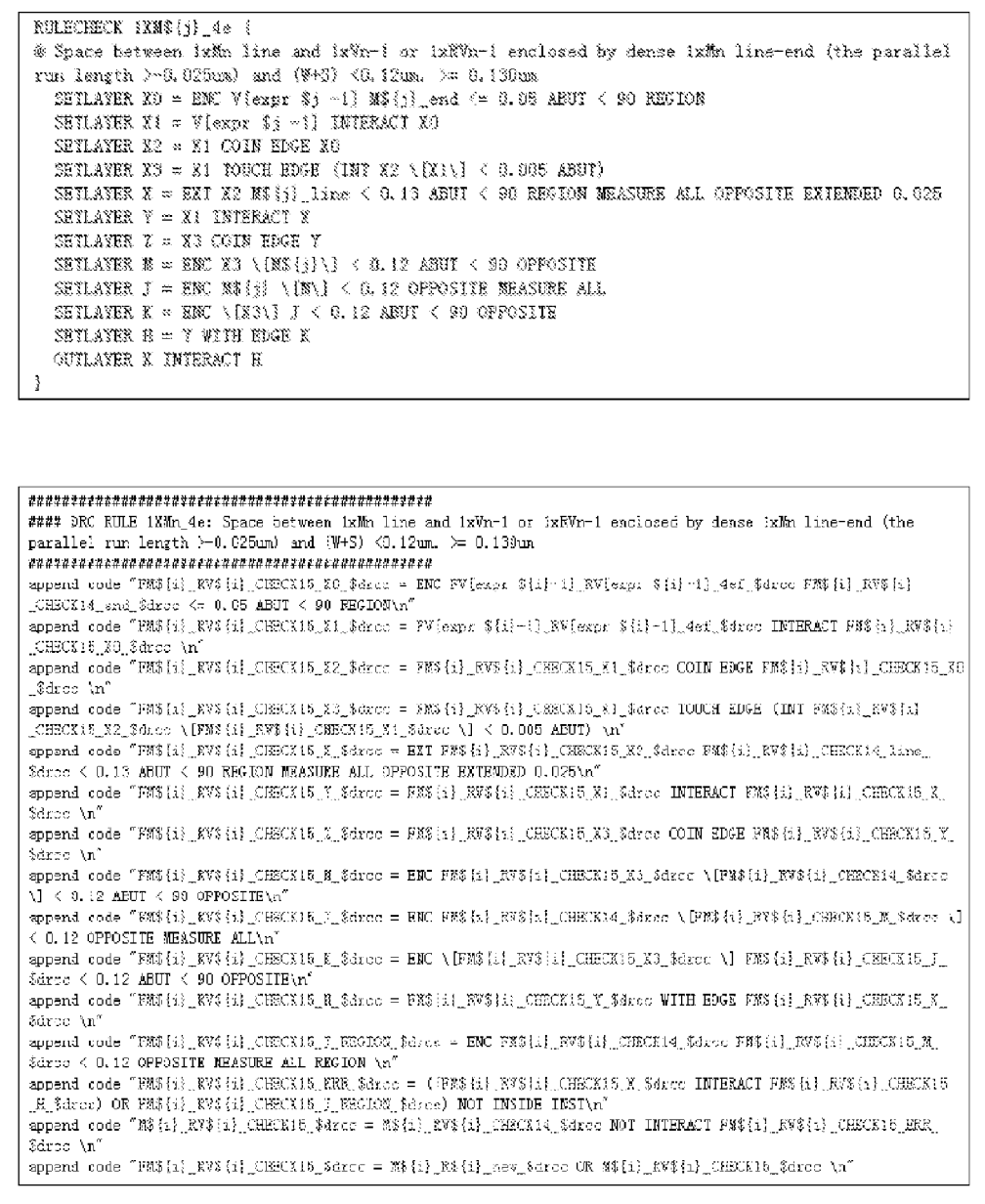

FIG. 1 compares the changes in a DRC code before and after modification. Specifically, the top of FIG. 1 illustrates an original DRC code (before modification), and the bottom of FIG. 1 illustrates the resulting DRC code after the original DRC code has been modified (for example, after updating/changing the layer name). As previously mentioned, the modification of the DRC code may result in a high workload since the modified DRC code is longer and complicated than the original DRC code as mass variable name need be modified in order to form a single code module for the RV filling and DRC verification functions. Also, errors in the modified DRC code are often detected during quality assurance processes. These errors may cause difficulties in establishing and maintaining operation of the RV runset file.

Furthermore, the integrated RV filling and DRC verification functions often have to be performed using a same software tool from a same Electronic Design Automation (EDA) vendor. A user is usually unable to combine and use different EDA software tools to separately perform the RV filling and the DRC verification functions. For example, software compatibility and other proprietary issues may prevent a user from using one EDA software tool to perform the RV filling function and another EDA software tool to perform the DRC verification function. As a result, the layout design method is constrained by the above limitations.

SUMMARY

The present disclosure addresses at least the above issues in the prior art.

According to an embodiment of the inventive concept, a computer-implemented layout design method is provided. The method is performed by a system comprising at least one processor and at least one memory. The method includes: (a) providing an original layout file; (b) performing a redundant via (RV) filling on the original layout file so as to generate a second layout file; (c) merging the second layout file with the original layout file to generate a third layout file; (d) performing a design rule check (DRC) verification on the third layout file by directly invoking a DRC code in a Process Design Kit (PDK); (e) generating, based on a result of the DRC verification, a fourth layout file including DRC errors; (f) performing a layout operation to remove DRC errors from the second layout file using the fourth layout file, so as to generate a fifth layout file; and (g) merging the fifth layout file with the original layout file to generate a sixth layout file.

In some embodiments, after merging the fifth layout file with the original layout file to generate the sixth layout file, the method may further include: (h) determining whether an actual number of DRC verifications is the same as a preset number of DRC verifications; and (i) designating the sixth layout file as a final layout file if the actual number and the preset number of DRC verifications are determined to be the same.

In some embodiments, if the actual number and the preset number of DRC verifications are determined to be different, the method may further include: using the sixth layout file as a new third layout file and repeating (d), (e), (f), (g), and (h) in order until the actual number and the preset number of DRC verifications are determined to be the same.

In some embodiments, performing the RV filling on the original layout file may further include: replacing one or more square single vias in the original layout file with rectangular through-holes or double square through-holes.

In some embodiments, the original layout file, the second layout file, the third layout file, the fourth layout file, the fifth layout file, and the sixth layout file may be in a Graphic Database System (GDS) format or an Open Artwork System Interchange Standard (OASIS) format.

In some embodiments, performing the layout operation to remove the DRC errors from the second layout file using the fourth layout file may further include: performing a "NOT interact" logic operation on the second layout file and the fourth layout file.

According to another embodiment of the inventive concept, a computer-implemented layout design system including at least one processor and at least one memory is provided. The system includes: a redundant via (RV) filling module configured to perform a RV filling on an original layout file so as to generate a second layout file; a layout merging module configured to merge the second layout file with the original layout file to generate a third layout file; a design rule check (DRC) verification module configured to: (a) perform a DRC verification on the third layout file by directly invoking a DRC code in a Process Design Kit (PDK); and (b) generate, based on a result of the DRC verification, a fourth layout file including DRC errors; and a layout operation module configured to: (c) perform a layout operation to remove DRC errors from the second layout file using the fourth layout file, so as to generate a fifth layout file; and (d) invoke the layout merging module again to merge the fifth layout file with the original layout file to generate a sixth layout file.

In some embodiments, the system may further include: a DRC verification comparator module configured to: (e) determine whether an actual number of DRC verifications is the same as a preset number of DRC verifications; and (f) designate the sixth layout file as a final layout file if the actual number and the preset number of DRC verifications are determined to be the same.

In some embodiments, if the actual number and the preset number of DRC verifications are determined to be different: the DRC verification module, the layout operation module, the layout merging module and the DRC verification comparator module may be configured to use the sixth layout file as a new third layout file and to repeat (a), (b), (c), (d), and (e) in order until the actual number and the preset number of DRC verifications are determined to be the same.

In some embodiments, the RV filling may further include: replacing one or more square single vias in the original layout file with rectangular through-holes or double square through-holes.

In some embodiments, the original layout file, the second layout file, the third layout file, the fourth layout file, the fifth layout file, and the sixth layout file are in a Graphic Database System (GDS) format or an Open Artwork System Interchange Standard (OASIS) format.

In some embodiments, the layout operation may further include: performing a "NOT interact" logic operation on the second layout file and the fourth layout file.

According to a further embodiment of the inventive concept, a set of tangible computer readable medium storing instructions that, when executed by one or more computer-implemented modules, cause the one or more computer-implemented modules to perform a layout design method, are provided. The one or more computer-implemented modules include a redundant via (RV) filling module, a layout merging module, a design rule check (DRC) verification module, and a layout operation module. The method includes: (a) providing an original layout file to the RV filling module; (b) performing, using the RV filling module, a RV filling on the original layout file so as to generate a second layout file; (c) merging, using the layout merging module, the second layout file with the original layout file to generate a third layout file; (d) performing, using the DRC verification module, a DRC verification on the third layout file by directly invoking a DRC code in a Process Design Kit (PDK); (e) generating using the DRC verification module, based on a result of the DRC verification, a fourth layout file including DRC errors; (f) performing, using the layout operation module, a layout operation to remove DRC errors from the second layout file using the fourth layout file, so as to generate a fifth layout file; and (g) merging, using the layout merging module again, the fifth layout file with the original layout file to generate a sixth layout file.

In some embodiments, the one or more computer-implemented modules may further include a DRC verification comparator module, and the method may further include: (h) determining, using the DRC verification comparator module, whether an actual number of DRC verifications is the same as a preset number of DRC verifications; and (i) designating, using the DRC verification comparator module, the sixth layout file as a final layout file if the actual number and the preset number of DRC verifications are determined to be the same.

In some embodiments, if the actual number and the preset number of DRC verifications are determined to be different, the method may further include: repeating (d), (e), (f), (g), and (h) in order using the respective DRC verification module, layout operation module, the layout merging module and DRC verification comparator module, until the actual number and the preset number of DRC verifications are determined to be the same.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

FIG. 1 illustrates the changes in a DRC code before and after modification, whereby the modification is a result of using a conventional RV insertion method during layout design.

FIG. 5 illustrates a set of flow control script according to an embodiment.

DETAILED DESCRIPTION

Figure 2A:
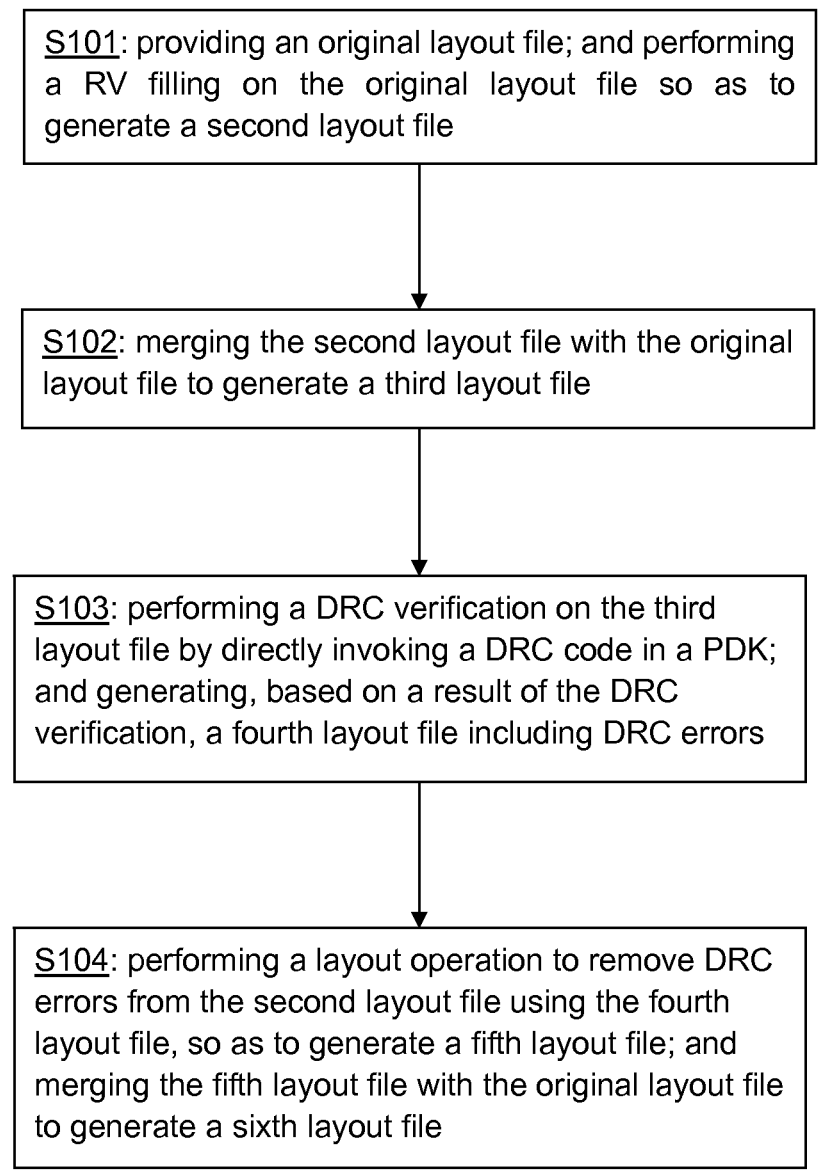
FIG. 2A is a flowchart of a layout design method according to an embodiment.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

Ordinary skill in the relevant art known techniques, methods and apparatus may not be discussed in detail, but in the application of these techniques, methods and apparatus, these techniques, methods and apparatus should be considered as part of this specification.

Like reference numerals denote the same elements throughout. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

It should be understood that the inventive concept is not limited to the embodiments described herein. Rather, the inventive concept may be modified in different ways to realize different embodiments.

According to an embodiment of the inventive concept, a layout design method is provided. A redundant via (RV) insertion in the exemplary layout design method provides the following advantages over the prior art.

First, a design rule check (DRC) code in a Process Design Kit (PDK) that is supplied by a foundry may be directly invoked during RV filling. No modification to the DRC code is necessary, regardless of the complexity of the design rules. Accordingly, workload can be reduced using the exemplary RV insertion method compared to the prior art.

Second, the RV filling and DRC check functions may be performed using a combination of different software tools from different EDA vendors. As a result, the user is not constrained to one software tool from a single Electronic Design Automation (EDA) vendor. In some instances, customizing and using different EDA software tools may lead to licensing cost savings.

Figure 2B:
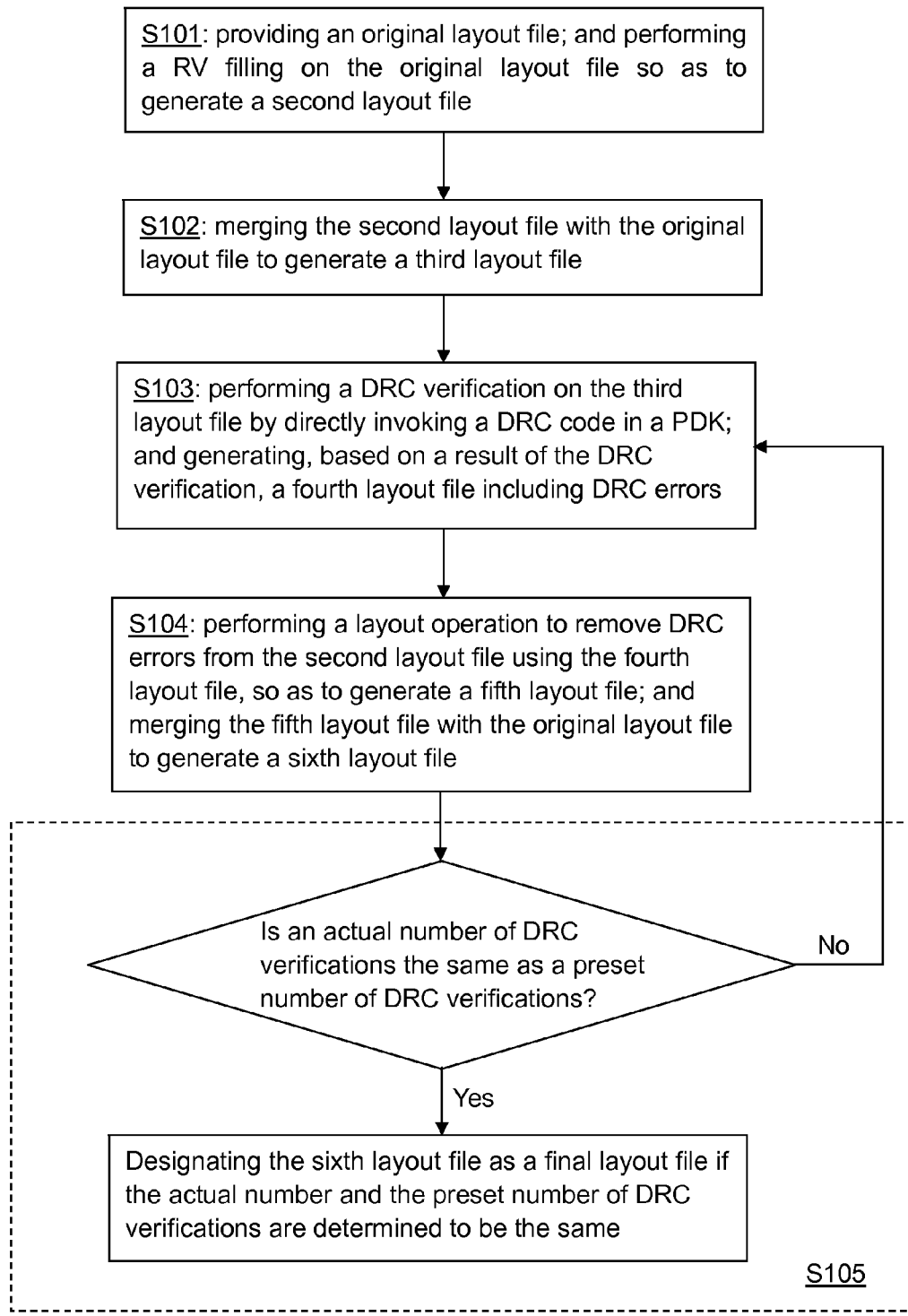
FIG. 2B is a flowchart of a layout design method according to another embodiment.

Next, a layout design method according to embodiments of the inventive concept will be described in detail with reference to FIGS. 2A and 2B. FIG. 2A is a flowchart of a layout design method according to an embodiment. FIG. 2B is a flowchart of a layout design method according to another embodiment. The methods may be implemented using hardware that may include an electrical/electronic component and/or a non-transitory data-storage device.

Referring to FIGS. 2A and 2B, the layout design method includes the following steps:

In Step S101, an original layout file is provided, and a RV filling is performed on the original layout file so as to generate a second layout file. Specifically, the RV filling is performed on the original layout file, so as to generate the second layout file including redundant vias (RVs).

The original layout file may be interchangeably referred to as a first layout file. The original layout file may be created by an EDA tool and includes square single vias. In some embodiments, the original layout file is a layout file that has already undergone a DRC verification. The RV filling includes replacing one or more square single vias in the original layout file with rectangular through-holes or double square through-holes.

In some embodiments, the original layout file and the second layout file may have a same file format for ease of operation. The file format may include, for example, Graphic Database System (GDS), Open Artwork System Interchange Standard (OASIS), etc.

Step S101 may be performed using a stand-alone module (e.g., an RV filling module). Unlike the prior art, the RV filling in Step S101 need not be combined and performed at the time as the DRC verification and layout operation using a common module.

In Step S102, the second layout file is merged with the original layout file to generate a third layout file.

The merging of the second layout file and the original layout file may be performed using a "Layout Merge" function in the software tools. The software tools may be provided by different EDA vendors.

In some embodiments, the third layout file may have the same file format as the original layout file and the second layout file. In some alternative embodiments, the third layout file may have a different file format from the original layout file and the second layout file.

Step S102 may be performed using another stand-alone module (e.g., a layout merge module).

In Step S103, a DRC verification is performed on the third layout file by directly invoking a DRC code in a Process Design Kit (PDK). Based on a result of the DRC verification, a fourth layout file including DRC errors is generated.

In the above embodiment, the DRC code that is invoked may be provided by one or more other parties or individuals. The arrangement can reduce the time and costs for re-coding (re-encoding).

The DRC verification is necessary because the RV filling in Step S101 may cause DRC errors. The result of the DRC verification is incorporated into the fourth layout file so that the fourth layout file includes all the DRC errors.

In some embodiments, the fourth layout file may have the same file format as the original layout file, the second layout file, and the third layout file. In some alternative embodiments, the fourth layout file may have a different file format from the original layout file, the second layout file, and the third layout file. Accordingly, the fourth layout file may be in a GDS file format or any other appropriate file format.

Step S103 may be performed using another stand-alone module (e.g., a DRC verification module). As previously mentioned in the Background section, conventional techniques include combining the RV filling, DRC check, and layout operation into a single module, which results in significant multi-line modifications to the DRC code in the PDK. Unlike the prior art, Step S103 need not be combined with the RV filling and layout operation into a common module. Accordingly, the exemplary embodiment can reduce workload and improve layout design efficiency.

In Step S104, a layout operation is performed to remove the DRC errors from the second layout file using the fourth layout file, so as to generate a fifth layout file. The fifth layout file is then merged with the original layout file to generate a sixth layout file.

Specifically, a logic operation is performed on the second layout file and the fourth layout file, whereby the DRC errors in the second layout file are removed using the fourth layout file to generate the fifth layout file. The logic operation may include performing a "NOT interact" logic operation on the second layout file and the fourth layout file. The fifth layout file is then merged with the original layout file to generate the sixth layout file.

As a result, upon completion of Step S104, the fifth layout file that is generated will not include any of the DRC errors in the DRC verification result from Step S103.

Step S104 may be performed using another stand-alone module (e.g., a layout operation module). Unlike the prior art, Step S104 need not be combined with the RV filling and DRC check into a common module.

In the above-described embodiment, by separating the RV filling, DRC verification, and layout operation into discrete steps that are separately performed by stand-alone modules, workload may be reduced and layout design efficiency may be improved. In addition, the RV filling and DRC verification may be performed using a combination of different software tools from different EDA vendors. As a result, the user is not constrained to using one software tool from a single EDA vendor. In some instances, customizing and using different EDA software tools may lead to licensing cost savings.

In Step S105, it is determined whether an actual number of DRC verifications is the same as a preset number of DRC verifications. If the actual number and the preset number of DRC verifications are the same, the sixth layout file is designated as a final layout file. If the actual number and the preset number of DRC verifications are different, Steps S103 through S105 are then repeated again until the actual number and the preset number of DRC verifications are the same. Thus, in some embodiments, the final layout file may correspond to the sixth layout file. In other embodiments, the final layout file may correspond to some further iteration/version of the layout file. For example, in those other embodiments, the final layout file may correspond to an nth layout file, whereby n is an integer greater than six.

By adding Step S105, DRC errors caused by the RV filling can be completely removed, regardless whether the layout has complex design rules (e.g., 28 nm or 14 nm technology node design rules). Accordingly, the yield for devices fabricated using the exemplary layout design method can be improved.

In some particular embodiments, if the sixth layout file that is generated in Step S104 does not have any DRC errors, then Step S105 may be omitted.

Steps S101 through S105 may be executed via a script (e.g., a cshell script). In those embodiments in which Step S105 is omitted, Steps S101 through S104 may be executed via another script (e.g., a cshell script). The contents and execution flow of the script is not limited to the above-described configuration, and may be modified in many different ways. Accordingly, RV filling can be incorporated into the exemplary layout design method, and DRC errors caused by the RV filling can be easily removed using the above steps.

As described above, the exemplary layout design method includes RV filling, layout merging, invoking the DRC code in the PDK to perform DRC verification, removing DRC verification errors, and other steps. The above steps can be performed using separate stand-alone modules, thereby reducing workload and improving layout design efficiency. In some instances, licensing costs may be reduced by customizing and using different EDA software tools.

FIG. 2A is a flowchart of the layout design method according to one embodiment. The layout design method in FIG. 2A includes:

Step S101: Providing an original layout file, and performing a RV filling on the original layout file so as to generate a second layout file.

Step S102: Merging the second layout file with the original layout file to generate a third layout file.

Step S103: Performing a DRC verification on the third layout file by directly invoking a DRC code in a Process Design Kit (PDK); and generating, based on a result of the DRC verification, a fourth layout file including DRC errors.

Step S104: Performing a layout operation to remove the DRC errors from the second layout file using the fourth layout file, so as to generate a fifth layout file; and merging the fifth layout file with the original layout file to generate a sixth layout file.

FIG. 2B is a flowchart of the layout design method according to another embodiment. The layout design method in FIG. 2B includes the steps described in FIG. 2A. In addition, the layout design method in FIG. 2B includes Step S105. The layout design method in FIG. 2B includes:

Step S101: Providing an original layout file, and performing a RV filling on the original layout file so as to generate a second layout file.

Step S102: Merging the second layout file with the original layout file to generate a third layout file.

Step S103: Performing a DRC verification on the third layout file by directly invoking a DRC code in a Process Design Kit (PDK); and generating, based on a result of the DRC verification, a fourth layout file including DRC errors.

Step S104: Performing a layout operation to remove the DRC errors from the second layout file using the fourth layout file, so as to generate a fifth layout file; and merging the fifth layout file with the original layout file to generate a sixth layout file.

Step S105: Determining whether an actual number of DRC verifications is the same as a preset number of DRC verifications; designating the sixth layout file as a final layout file if the actual number and the preset number of DRC verifications are the same; and repeating Steps S103 through S105 in order if the actual number and the preset number of DRC verifications are different, until the actual number and the preset number of DRC verifications are the same.

Next, a layout design system according to an embodiment of the inventive concept is described with reference to FIG. 3. The layout design system may be used to implement the layout design methods described in FIGS. 2A and 2B.

Figure 3:
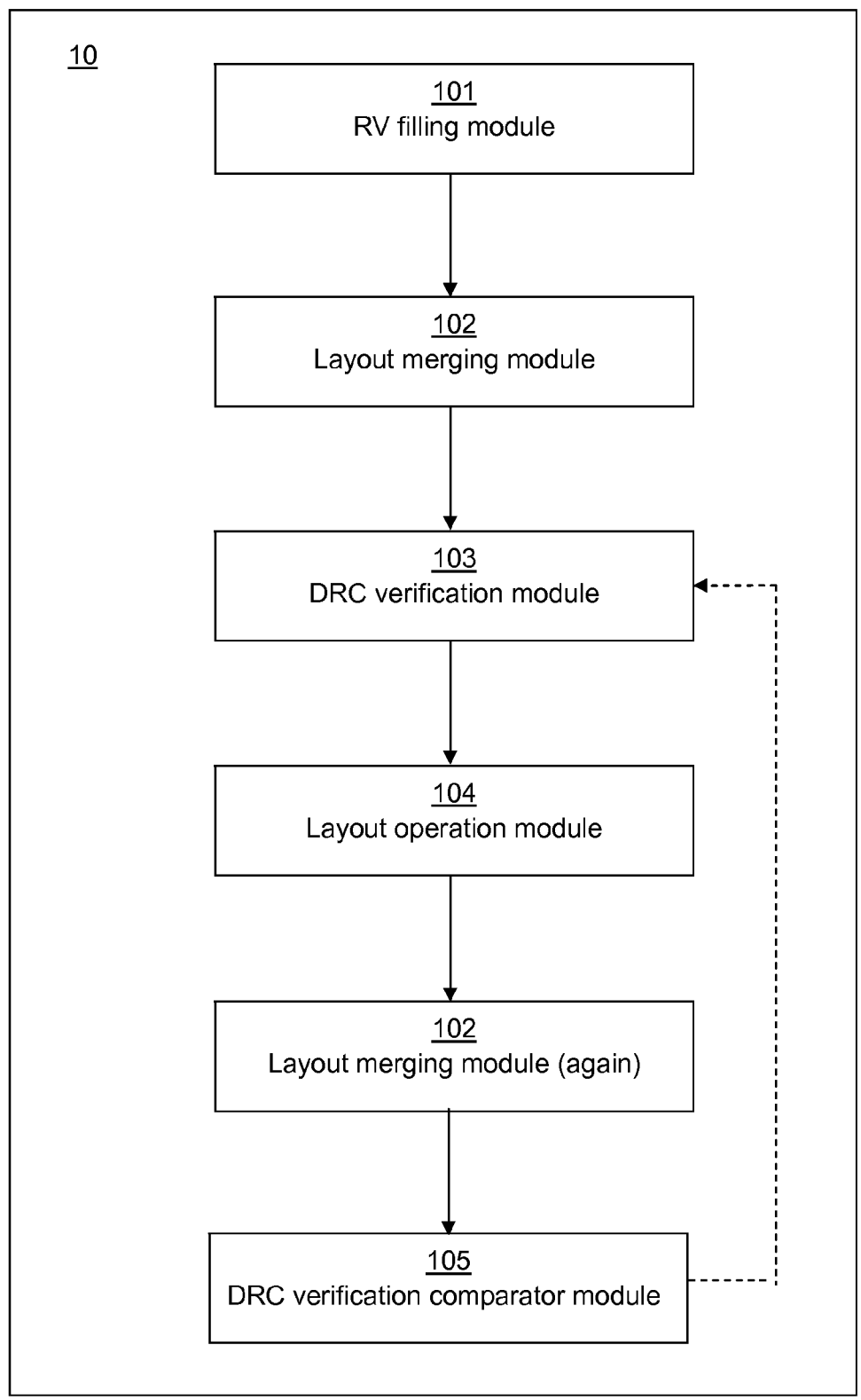
FIG. 3 is a block diagram of a layout design system according to an embodiment.

FIG. 3 is a block diagram of a layout design system 10 according to an embodiment. As shown in FIG. 3, the layout design system 10 includes a RV filling module 101, a layout merging module 102, a DRC verification module 103, and a layout operation module 104.

The RV filling module 101 is configured to perform a RV filling on an original layout file so as to generate a second layout file. Specifically, the RV filling is performed on the original layout file, so as to generate the second layout file including redundant vias (RVs).

The original layout file may be interchangeably referred to as a first layout file. The original layout file may be created by an EDA tool and includes square single vias. In some embodiments, the original layout file is a layout file that has already undergone a DRC verification. The RV filling includes replacing one or more square single vias in the original layout file with rectangular through-holes or double square through-holes.

In some embodiments, the original layout file and the second layout file may have a same file format for ease of operation. The file format may include, for example, Graphic Database System (GDS), Open Artwork System Interchange Standard (OASIS), etc.

The RV filling module 101 is a stand-alone module. The RV filling module 101 may be configured to solely perform RV filling on the original layout file, so as to generate the second layout file including redundant vias (RVs). Unlike the prior art, the RV filling module 101 need not include other functions such as DRC verification and/or layout operation.

The layout merging module 102 may be another stand-alone module. The layout merging module 102 is configured to merge the second layout file with the original layout file to generate a third layout file. The merging of the second layout file and the original layout file may be performed using a "Layout Merge" function in the software tools. The software tools may be provided by different EDA vendors.

In some embodiments, the third layout file may have the same file format as the original layout file and the second layout file. In some alternative embodiments, the third layout file may have a different file format from the original layout file and the second layout file.

The DRC verification module 103 may be another stand-alone module. The DRC verification module 103 is configured to: perform a DRC verification on the third layout file by directly invoking a DRC code in a Process Design Kit (PDK); and generate, based on a result of the DRC verification, a fourth layout file including DRC errors.

In the above embodiment, the DRC code that is invoked may be provided by one or more other parties or individuals. The arrangement can reduce the time and costs for re-coding (re-encoding).

The DRC verification is necessary because the RV filling performed by the RV filling module 101 may cause DRC errors. The result of the DRC verification is then incorporated into the fourth layout file so that the fourth layout file includes all the DRC errors.

In some embodiments, the fourth layout file may have the same file format as the original layout file, the second layout file, and the third layout file. In some alternative embodiments, the fourth layout file may have a different file format from the original layout file, the second layout file, and the third layout file. Accordingly, the fourth layout file may be in a GDS file format or any other appropriate file format.

The layout operation module 104 may be another stand-alone module. The layout operation module 104 is configured to: perform a layout operation to remove DRC errors from the second layout file using the fourth layout file, so as to generate a fifth layout file; and invoke the layout merging module 102 again to merge the fifth layout file with the original layout file to generate a sixth layout file.

Specifically, the layout operation module 104 is configured to perform a logic operation on the second layout file and the fourth layout file, whereby the DRC errors in the second layout file are removed using the fourth layout file, so as to generate the fifth layout file. The logic operation may include performing a "NOT interact" logic operation on the second layout file and the fourth layout file. It is noted that the fifth layout file that is generated will not include any of the DRC errors in the DRC verification result. The fifth layout file is then merged with the original layout file by invoking the layout merging module 102 again to generate the sixth layout file.

In some embodiments, the layout design system 10 may further include a DRC verification comparator module 105.

The DRC verification comparator module 105 may be another stand-alone module. The DRC verification comparator module 105 is configured to: determine whether an actual number of DRC verifications is the same as a preset number of DRC verifications; and designate the sixth layout file as a final layout file if the actual number and the preset number of DRC verifications are the same.

If the actual number and the preset number of DRC verifications are different, the DRC verification module 103, the layout operation module 104, the layout merging module 102 and the DRC verification comparator module 105 are configured to repeat their respective functions in order, until the actual number and the preset number of DRC verifications are the same.

For example, in some embodiments, if the actual number and the preset number of DRC verifications are different, the DRC verification module 103 will perform Step S103, the layout operation module 104/the layout merging module 102 will perform Step S104, and the DRC verification comparator module 105 will perform Step S105 again until the actual number and the preset number of DRC verifications are the same. Thus, in some embodiments, the final layout file may correspond to the sixth layout file. In other embodiments, the final layout file may correspond to some further iteration/version of the layout file. For example, in those other embodiments, the final layout file may correspond to an nth layout file, whereby n is an integer greater than six.

In some particular embodiments, the DRC verification comparator module 105 may be omitted from the layout design system 10. For example, if the sixth layout file that is generated by the layout operation module 104/the layout merging module 102 does not have any DRC errors, then the DRC verification comparator module 105 may be omitted from the layout design system 10.

When the DRC verification comparator module 105 is included in the layout design system 10, the DRC errors caused by the RV filling can be completely removed, regardless whether the layout has complex design rules (e.g., 28 nm or 14 nm manufacturing design rules). Accordingly, the yield for devices fabricated using the layout design system 10 can be improved.

In the above, each module (e.g., the RV filling module 101, the layout merging module 102, the DRC verification module 103, the layout operation module 104, and the DRC verification comparator module 105) may be configured to perform its function by executing a script (e.g., a cshell script). The contents and execution flow of the script is not limited to the above-described configuration, and may be modified in many different ways.

Figure 4:
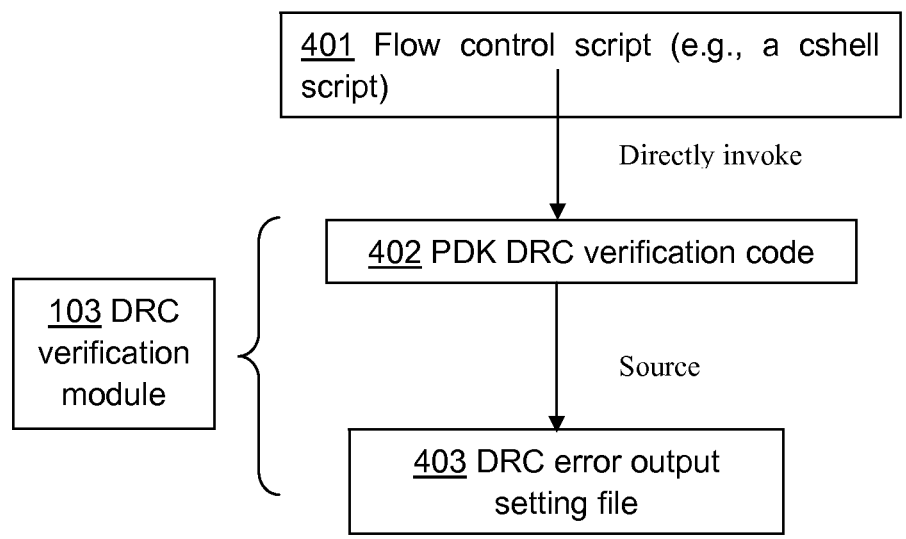
FIG. 4 illustrates a flowchart related to operation of a DRC verification module according to an embodiment.

FIG. 4 illustrates a flowchart related to operation of a DRC verification module according to an embodiment. Steps S101 through S105 may be executed via a set of flow control script 401 (e.g., a cshell script). The contents and execution flow of the script 401 may be configured according to particular embodiments. The script 401 may invoke PDK DRC verification code 402 (which may be included in and/or associated with the DRC verification module 103). Subsequently, a DRC error layout is exported by sourcing DRC error output setting file 403 (which may be included in and/or associated with the DRC verification module 103).

Figure 6:
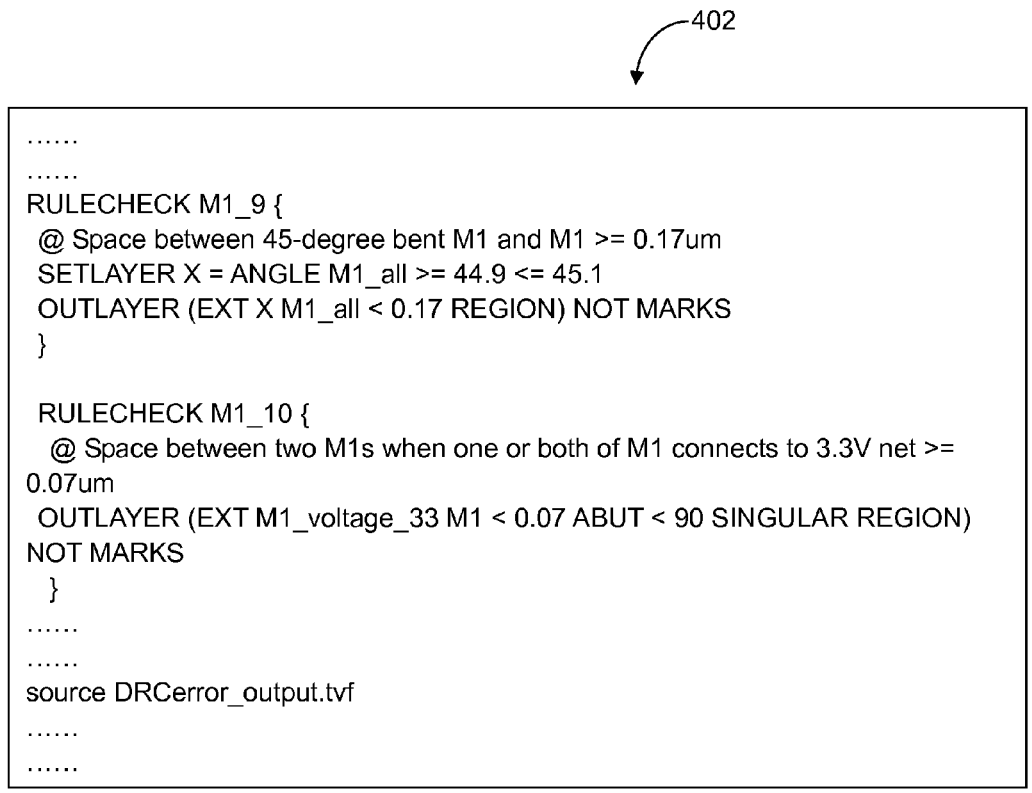
FIG. 6 illustrates a set of PDK DRC verification code according to an embodiment.
Figure 7:
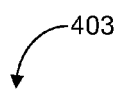
FIG. 7 illustrates content of a DRC error output setting file according to an embodiment.

FIG. 5 illustrates the flow control script 401 according to an embodiment. FIG. 6 illustrates the PDK DRC verification code 402 according to an embodiment. The PDK DRC verification code 402 may be invoked using the statement "$drc_rule" in the script 401. The PDK DRC verification code 402 may include the statement "source DRCerror_output.tvf" for enabling the DRC error output setting file 403 to generate the DRC error layout. FIG. 7 illustrates content of the DRC error output setting file 403 according to an embodiment. In an embodiment, the DRC error output setting file 403 may include output code for outputting a "rule M1_9" DRC error and a "rule M1_10" DRC error.

As described above, the exemplary layout design system includes an RV filling module, a layout merging module, a DRC verification module, a layout operation module, and other stand-alone modules (e.g., a DRC verification comparator module). By using separate stand-alone modules to perform the different functions, workload may be reduced and layout design efficiency may be improved. In some instances, licensing costs may be reduced by customizing and using different EDA software tools in stand-alone modules.

As previously described, the prior art requires combining the different functions into a file and extensively modifying the DRC code in the PDK for the RV filling. The exemplary layout design system circumvents the above issues by directly invoking the DRC code in the PDK to perform DRC verification, thereby reducing the workload. The modularity of the exemplary layout design system also allows each module to be independently provided. For example, a software from a first EDA vendor may be used for RV filling, and a software from a second EDA vendor may be used for DRC verification. Accordingly, the user can combine software tools from different EDA vendors to separately perform different functions, which may reduce software licensing costs.

Each of the modules in the layout design system 10 may include at least one of a nonvolatile (NVM) memory, at least one processor, at least one instruction and data cache, and an input/output interface.

The nonvolatile memory (NVM) can include ROM, PROM, EPROM, EEPROM, battery-backed CMOS, flash memory, a hard disk, or other such storage that can be used to store a key and/or other information, as needed to implement the various embodiments described herein.

The processor may be, for example, a single or multiple microprocessors, field programmable gate arrays (FPGAs), or digital signal processors (DSPs) capable of executing particular sets of instructions.

The cache is local memory within the device or chip. For example, the cache may be an on-chip memory that temporarily stores data or instructions operated on by the processor.

The input/output interface is software or hardware that provides the digital signature to other components for further processing.

Each module in the layout design system 10 may be, for example, hardware, software, or a combination of hardware and software, that performs the respective function for the corresponding module. For example, the respective functions (e.g., RV filling, layout merging, DRC verification, layout operation, and DRC verification comparison) may be executed via one or more scripts (e.g., a cshell script) using software, hardware, or a combination of hardware and software.

Some of the functions performed by the layout design system 10 may be implemented using computer-readable instructions stored on a tangible non-transitory computer-readable medium, such as a flexible disk, a hard disk, a CD-ROM (compact disk-read only memory), and MO (magneto-optical), a DVD-ROM (digital versatile disk-read only memory), a DVD RAM (digital versatile disk-random access memory), or a semiconductor memory. Alternatively, some of the methods can be implemented in hardware components or combinations of hardware and software such as, for example, ASICs, special purpose computers, or general purpose computers.

Embodiments of a layout design method and system have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept. Therefore, the inventive concept should not be limited to the foregoing disclosure, but rather construed by the claims appended hereto.

What is claimed is:

1. A computer-implemented layout design method, the method to be performed by a system comprising at least one processor and at least one memory, the method comprising:
    (a) providing an original layout file;
    (b) performing, using a redundant via (RV) filling module, a redundant via (RV) filling on the original layout file so as to generate a second layout file;
    (c) merging, using a layout merging module, the second layout file with the original layout file to generate a third layout file;
    (d) performing a design rule check (DRC) verification on the third layout file by directly invoking a DRC code in a Process Design Kit (POK);
    (e) generating, based on a result of the DRC verification, a fourth layout file including DRC errors;
    (f) performing, using a layout operation module, a layout operation to remove DRC errors from the second layout file using the fourth layout file, so as to generate a fifth layout file;
    (g) merging, using the layout merging module, the fifth layout file with the original layout file to generate a sixth layout file;
    (h) determining whether an actual number of DRC verifications is the same as a preset number of DRC verifications; and
    (i) designating the sixth layout file as a final layout file if the actual number and the preset number of DRC verifications are determined to be the same.

2. The method according to claim 1, wherein if the actual number and the preset number of DRC verifications are determined to be different, the method further comprising:
    repeating (d), (e), (f), (g), and (h) in order until the actual number and the preset number of DRC verifications are determined to be the same.

3. The method according to claim 1, wherein performing the RV filling on the original layout file further comprises:
    replacing one or more square single vias in the original layout file with rectangular through-holes or double square through-holes.

4. The method according to claim 1, wherein the original layout file, the second layout file, the third layout file, the fourth layout file, the fifth layout file, and the sixth layout file are in a Graphic Database System (GOS) format or an Open Artwork System Interchange Standard (OASIS) format.

5. The method according to claim 1, wherein performing the layout operation to remove the DRC errors from the second layout file using the fourth layout file further comprises:

performing a "NOT interact" logic operation on the second layout file and the fourth layout file.

6. A computer-implemented layout design system comprising at least one processor and at least one memory, the system comprising:

a redundant via (RV) filling module configured to perform a RV filling on an original layout file so as to generate a second layout file;

a layout merging module configured to merge the second layout file with the original layout file to generate a third layout file;

a design rule check (DRC) verification module configured to: (a) perform a DRC verification on the third layout file by directly invoking a DRC code in a Process Design Kit (POK); and (b) generate, based on a result of the DRC verification, a fourth layout file including DRC errors;

a layout operation module configured to: (c) perform a layout operation to remove DRC errors from the second layout file using the fourth layout file, so as to generate a fifth layout file; and (d) merge the fifth layout file with the original layout file to generate a sixth layout file; and a DRC verification comparator module configured to: (e) determine whether an actual number of DRC verifications is the same as a preset number of DRC verifications; and (f) designate the sixth layout file as a final layout file if the actual number and the preset number of DRC verifications are determined to be the same.

7. The system according to claim 6, wherein if the actual number and the preset number of DRC verifications are determined to be different:

the DRC verification module, the layout operation module, and the DRC verification comparator module are configured to repeat (a), (b), (c), (d), and (e) in order until the actual number and the preset number of DRC verifications are determined to be the same.

8. The system according to claim 6, wherein the RV filling further comprises: replacing one or more square single vias in the original layout file with rectangular through-holes or double square through-holes.

9. The system according to claim 6, wherein the original layout file, the second layout file, the third layout file, the fourth layout file, the fifth layout file, and the sixth layout file are in a Graphic Database System (GOS) format or an Open Artwork System Interchange Standard (OASIS) format.

10. The system according to claim 6, wherein the layout operation further comprises:

performing a "NOT interact" logic operation on the second layout file with the fourth layout file.

11. A set of tangible computer readable medium storing instructions that, when executed by one or more computer-implemented modules, cause the one or more computer-implemented modules to perform a layout design method, the one or more computer-implemented modules comprising a redundant via (RV) filling module, a layout merging module, a design rule check (DRC) verification module, a layout operation module, and a DRC verification comparator module, the method comprising:

(a) providing an original layout file to the RV filling module;

(b) performing, using the RV filling module, a RV filling on the original layout file so as to generate a second layout file;

(c) merging, using the layout merging module, the second layout file with the original layout file to generate a third layout file;

(d) performing, using the DRC verification module, a DRC verification on the third layout file by directly invoking a DRC code in a Process Design Kit (POK);

(e) generating using the DRC verification module, based on a result of the DRC verification, a fourth layout file including DRC errors;

(f) performing, using the layout operation module, a layout operation to remove DRC errors from the second layout file using the fourth layout file, so as to generate a fifth layout file;

(g) merging, using the layout merging module, the fifth layout file with the original layout file to generate a sixth layout file, (h) determining, using the DRC verification comparator module, whether an actual number of DRC verifications is the same as a preset number of DRC verifications; and (i) designating, using the DRC verification comparator module, the sixth layout file as a final layout file if the actual number and the preset number of DRC verifications are determined to be the same.

12. The set of tangible computer readable medium storing instructions of claim 11, wherein if the actual number and the preset number of DRC verifications are determined to be different, the method further comprising:

regard the sixth layout file as new third layout file to repeat (d), (e), (f), (g), and (h) in order using the respective DRC verification module, layout operation module, the layout merging module and DRC verification comparator module, until the actual number and the preset number of DRC verifications are determined to be the same.

* * * * *